(12) United States Patent
Morin et al.

(10) Patent No.: US 8,237,121 B2
(45) Date of Patent: Aug. 7, 2012

(54) ALTERNATING ROW INFRARED FILTER FOR AN IMAGE SENSOR

(75) Inventors: Jeffrey L. Morin, Lincoln Park, MI (US); Inayat Khajasha, Fremont, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 725 days.

(21) Appl. No.: 12/027,928

(22) Filed: Feb. 7, 2008

(65) Prior Publication Data

US 2009/0200469 A1 Aug. 13, 2009

(51) Int. Cl.
*H01L 31/00* (2006.01)
*H01L 27/14* (2006.01)

(52) U.S. Cl. ........... 250/338.4; 250/339.01; 250/339.05; 257/294; 257/432

(58) Field of Classification Search .............. 250/338.4, 250/339.01, 339.05
See application file for complete search history.

(56) References Cited

U.S. PATENT DOCUMENTS

| | | | | |
|---|---|---|---|---|
| 5,929,432 A * | 7/1999 | Yamakawa | ......... | 250/208.1 |
| 6,380,539 B1 * | 4/2002 | Edgar | ......... | 250/339.05 |
| 7,259,788 B1 * | 8/2007 | Olding et al. | ......... | 348/273 |
| 2002/0063214 A1 * | 5/2002 | Hsiao et al. | ......... | 250/338.4 |
| 2003/0179457 A1 * | 9/2003 | Dobashi et al. | ......... | 359/619 |
| 2004/0256561 A1 * | 12/2004 | Beuhler et al. | ......... | 250/339.05 |
| 2004/0266051 A1 * | 12/2004 | Kojima et al. | ......... | 438/57 |
| 2005/0258351 A1 * | 11/2005 | Ma | ......... | 250/239 |
| 2006/0043260 A1 | 3/2006 | Ma et al. | | |

\* cited by examiner

*Primary Examiner* — David Porta
*Assistant Examiner* — Jessica L Eley
(74) *Attorney, Agent, or Firm* — Blakely Sokoloff Taylor & Zafman LLP

(57) ABSTRACT

An image sensor includes near-infrared cut filters formed over an array of photosensitive elements in a predetermined pattern. The near-infrared cut filters may be formed over one half of a photosensitive element in a split pixel arrangement, over one half the photosensitive elements in the array, over every other photosensitive element in the array, and/or in a checkerboard pattern.

20 Claims, 3 Drawing Sheets

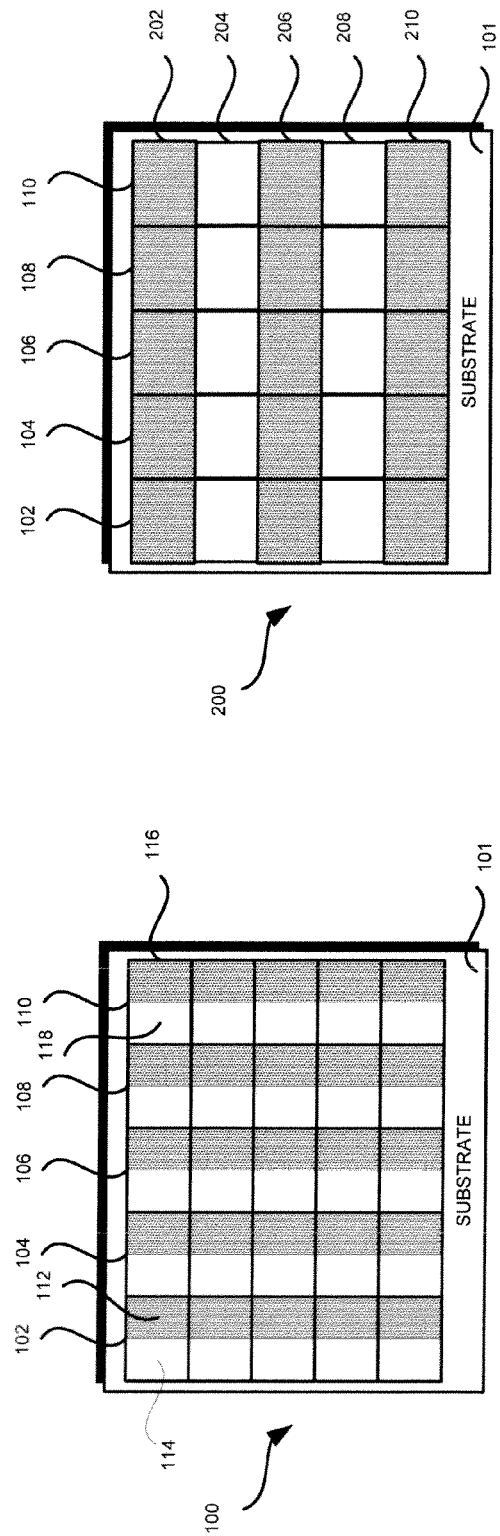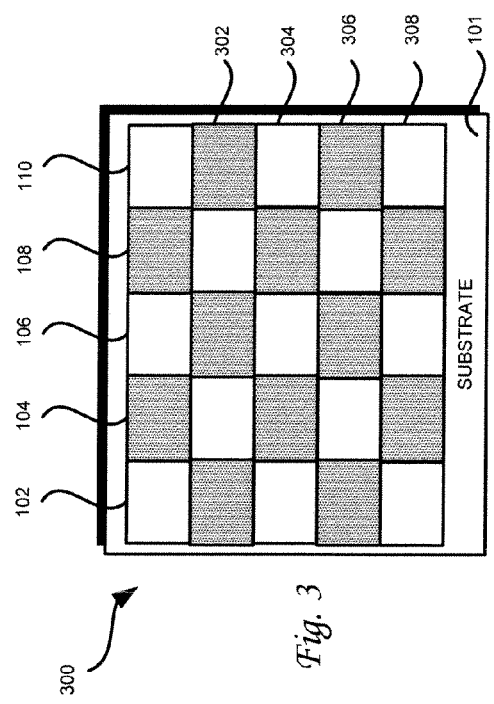

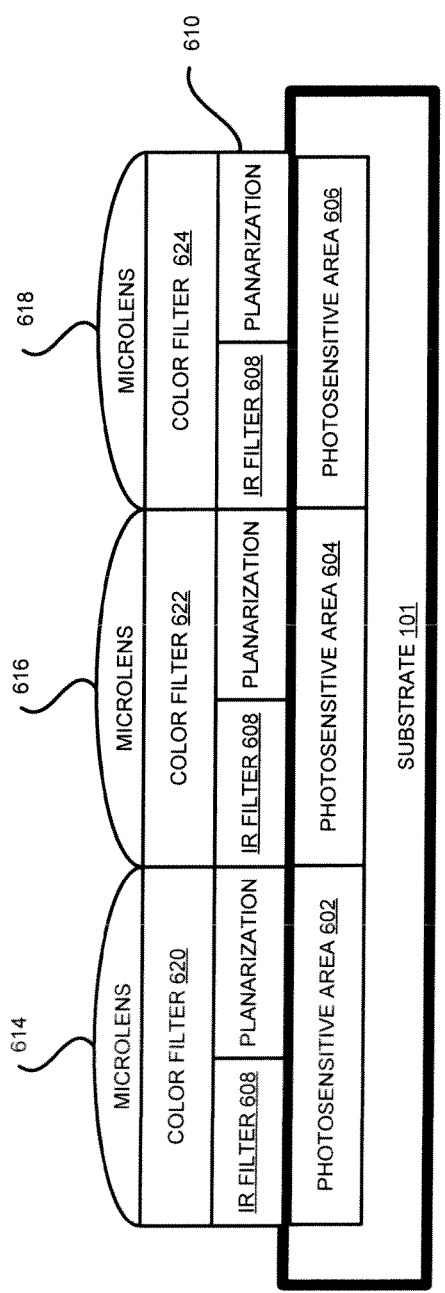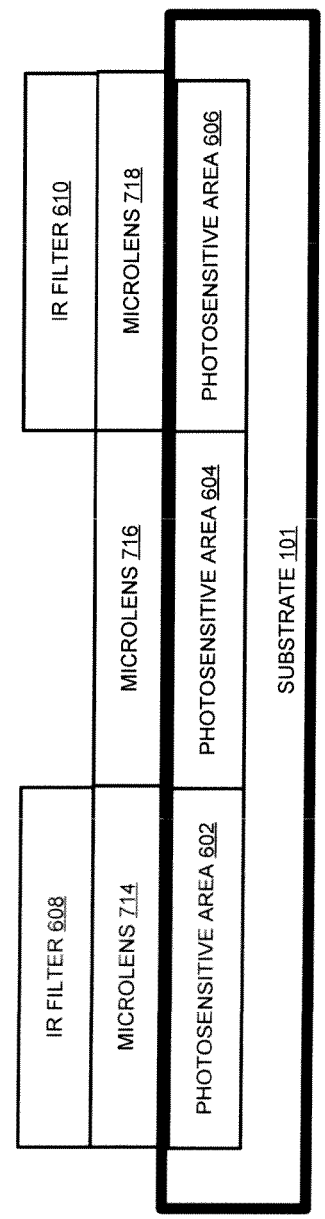

ALTERNATING ROW INFRARED FILTER FOR AN IMAGE SENSOR

BACKGROUND

1. Field

Embodiments of the present invention relate to image sensors and, in particular, to near-infared and/or infrared cut filters for image sensors.

2. Discussion of Related Art

In general, conventional image sensors perform well to generate images. A typical image sensor may be fabricated from a complementary metal oxide semiconductor (CMOS) technology. Charge couple device (CCD) technology is also suitable.

Conventional image sensors suffer from some limitations, however. The most common semiconductor-based image sensing devices are silicon-based and respond not only to visible light, but also to infrared and/or near infrared light. It is difficult to capture quality images in normal light conditions without an infrared and/or near infrared blocking filter because the infrared light typically swamps the image sensor performance and thereby corrupts the output levels. Similarly, it can be difficult to capture quality images in low light conditions with an infrared and/or near infrared blocking filter.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 1 is a top view illustrating near-infrared and/or infrared cut filters arranged in a pattern over an array of photosensitive elements according to an embodiment of the present invention in which the near-infrared and/or infrared cut filters are formed over one half of each photosensitive element in the array of photosensitive elements;

FIG. 2 is a top view illustrating near-infrared and/or infrared cut filters arranged in a pattern over an array of photosensitive elements according to an alternative embodiment of the present invention in which the near-infrared and/or infrared cut filters are formed over every other row of the array of photosensitive elements;

FIG. 3 is a top view illustrating near-infrared and/or infrared cut filters arranged in a pattern over an array of photosensitive elements according to an embodiment of the present invention in which the near-infrared and/or infrared cut filters are formed over every other photosensitive element in the array of photosensitive elements;

FIG. 6 is a cross-section view of an image sensor according to an embodiment of the present invention; and FIG. 7 is a cross-section view of an image sensor according to an alternative embodiment of the present invention.

DETAILED DESCRIPTION OF EMBODIMENTS

Figure 4:
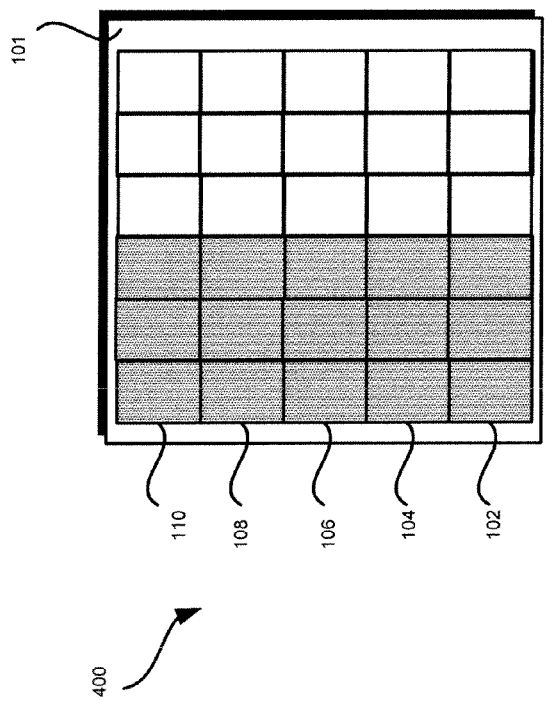
FIG. 4 is a top view illustrating near-infrared and/or infrared cut filters arranged in a pattern over an array of photosensitive elements according to an embodiment of the present invention in which the near-infrared and/or infrared cut filters are formed over one half of the array of photosensitive elements.

In the below description, numerous specific details, such as, for example, particular processes, materials, devices, and so forth are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

Embodiments of the present invention include an image sensor having near-infrared cut filters formed over a portion of an array of photosensitive elements in a predetermined pattern. The pattern may be such that the near-infrared cut filters are formed over one half of a photosensitive element in a split pixel arrangement. The pattern may be such that the near-infrared cut filters are formed over one half the photosensitive elements in the array. The pattern may be such that the near-infrared cut filters are formed over every other photosensitive element in the array. The pattern may be a checkerboard pattern.

When light is incident on the image sensor, the portion(s) of the photosensitive elements having the near-infrared cut filters filter out the near-infrared light while permitting visible light to pass. The portion(s) of the photosensitive elements that do not have the near-infrared cut filters allow the near-infrared light to pass.

One advantage of embodiments of the present invention is that the image sensor is sensitive in low light conditions, such as night time, as well as being sufficiently responsive to colors during the normal light conditions, such as daytime. Some pixels may be used in the daytime while other pixels may be used during nighttime conditions. Alternatively, all pixels may be active and their signals can be combined to provide an improved image responsive to both visible colors and near-infrared light at the same time. The result is an image sensor with improved capturing of colors in normal light conditions as well as improved sensitivity in low light conditions. Other features and advantages of the present invention will be apparent from the accompanying drawings and from the detailed description that follows.

FIG. 1 is a top view illustrating an image sensor 100 with includes several photosensitive elements 102, 104, 106, 108, and 1 10 arranged in an array of two dimensional rows and columns in a semiconductor substrate 101 according to an embodiment of the present invention. In the illustrated embodiment, a five by five array of rows and columns are shown. Of course, the array can include upwards of thousands of rows and/or columns, or more. Similarly, the array may have an arrangement other than columns and rows.

Each photosensitive element typically includes an element that converts light into an electric signal proportional to the intensity of light detected. The photosensitive element may be a photodiode or other solid state device. Other photosensitive elements also may be utilized as well. The resulting pixels may include amplification and readout circuitry such as a CMOS transistor (not shown), for example. For purposes of clarity, only reference numbers for photosensitive elements 102, 104, 106, 108, and 110 are illustrated. The photosensitive elements may be formed in the semiconductor substrate 101 in any suitable known manner.

Formed atop at least some of the photosensitive elements are near-infrared and/or infrared cut filters arranged in a predetermined pattern. In the embodiment illustrated in FIG. 1, the photosensitive elements 102, 104, 106, 108, and 110 are in a split arrangement in which an individual photosensitive element is split into two regions. Each region has at least in part its own signal processing (e.g., readout and/or amplification circuitry).

In the split pixel arrangement, near-infrared and/or infrared cut filters are formed only over one half of a photosensitive element. For instance, photosensitive element 102 has a near-infrared and/or infrared cut filter, represented by shading, formed over one half 112 of its top portion and the other half 114 of the photosensitive element 102 does not have a near-infrared and/or infrared cut filter. Similarly, photosensitive element 110 has a near-infrared and/or infrared cut filter formed over one half 116 of its top portion and the other half 118 of the photosensitive element 110 does not have a near-infrared and/or infrared cut filter formed thereon. Remaining photosensitive elements 104, 106, 108, and others in the array also may have near-infrared and/or infrared cut filters formed over one half of their top portions with the other halves do not have near-infrared and/or infrared cut filters, as illustrated. For purposes of clarity, however, these reference numbers are not illustrated.

According to embodiments of the present invention, in conditions where visible light is adequate and near-infrared and/or infrared light may be problematic to an image sensor, such as in the daytime, the portion of a photosensitive element with a near-infrared and/or infrared cut filter may be activated and the portion of the photosensitive element without the near-infrared and/or infrared cut filter may be deactivated. Visible light is detected at those photosensitive element portions having the near-infrared and/or infrared cut filters and the near-infrared and/or infrared light is filtered out. With the near-infrared and/or infrared light filtered out, the image sensor 100 may be more sensitive to colors during the daytime. The amplification and/or readout circuitry may activate only for those portions of the photosensitive elements with the near-infrared and/or infrared cut filters. For some embodiments, short exposure portions of the photosensitive elements have the near-infrared and/or infrared cut filters.

In conditions where visible light may not be adequate, near-infrared and/or infrared light is abundant and not problematic, such as in the evenings, the portion of the photosensitive element without the near-infrared and/or infrared cut filter may be activated and the portion of the photosensitive element with the near-infrared and/or infrared cut filter may be deactivated. Near-infrared and/or infrared light is detected at those photosensitive element portions not having the near-infrared and/or infrared cut filters and there is no problematic amount of visible that should be filtered out. With the near-infrared and/or infrared light allowed to enter split portion of the photosensitive elements, the image sensor 100 may be more sensitive in low visible light conditions such as nighttime. The amplification and/or readout circuitry may activate only for those portions of the photosensitive elements without the near-infrared and/or infrared cut filters. For some embodiments, long exposure portions of the photosensitive elements do not have the near-infrared and/or infrared cut filters. For some embodiments, short exposure portions of the photosensitive elements do have the near-infrared and/or infrared cut filters. This feature may decrease blooming so that a charge from one pixel will not overflow into other pixels due to exceeding the dynamic range of the photosensitive element.

In some embodiments, the near-infrared and/or infrared cut filters may be absorptive filters. For these embodiments, the near-infrared and/or infrared cut filters may be made from glass or plastic to which various compounds have been added. The near-infrared and/or infrared absorptive filters may absorb near-infrared and/or infrared wavelengths in the electromagnetic spectrum. Suitable absorptive filters include any known filter that absorbs near-infrared and/or infrared light, such as a Wratten filter, for example.

For other embodiments, the near-infrared and/or infrared cut filters may be interference filters and/or dichroic filters. For these embodiments, the near-infrared and/or infrared cut filters may be made of multiple thin layers of dielectric and/or metallic material having differing refractive indexes. The near-infrared and or infrared interference filters may select visible light wavelengths over near-infrared and/or infrared wavelengths owing to the interference effects that take place between the incident light and the light reflected at the boundaries of the layers of material.

The near-infrared and/or infrared material may be formed over the appropriate photosensitive portions of the photosensitive elements in any suitable known manner. For example, typically on top of the photosensitive elements there is a stack of various intervening layers that might include the color filters and various metal conducting lines. For some embodiments, the near-infrared and/or infrared cut filters may be formed in the stack according to known deposition, etching, masking, planarization, and other suitable techniques.

The image sensor 100 is only one embodiment of the present invention. FIG. 2 is a top view illustrating an image filter 200 according to an alternative embodiment of the present invention. In the embodiment illustrated in FIG. 2, an every other row pattern is shown and the photosensitive elements are arranged in a five by five array of rows and columns. In the every other row pattern, each photosensitive element in row 202, 206, and 210 has a near-infrared and/or infrared cut filter, represented by shading, formed thereon. None of the photosensitive elements in the rows 204 or 208 have near-infrared and or infrared cut filters.

FIG. 3 is a top view illustrating an image filter 300 according to still another embodiment of the present invention. In the embodiment illustrated in FIG. 3, near-infrared and/or infrared cut filters, indicated by shading, are formed over every other photosensitive element in the array. In the every other photosensitive element pattern, the near-infrared and/or infrared cut filters, represented by shading, form a checker board pattern on the array 300. As illustrated, every other photosensitive element in a row 302 has a near-infrared and/or infrared cut filter, every other photosensitive element in a row 304 has a near-infrared and/or infrared cut filter, every other photosensitive element in a row 306 has a near-infrared and/or infrared cut filter, and every other photosensitive element in a row 308 has a near-infrared and/or infrared cut filter.

FIG. 4 is a top view illustrating an image filter 400 according to still another embodiment of the present invention. In the embodiment illustrated in FIG. 4, near-infrared and/or infrared cut filters, indicated by shading, are formed over one half of adjacent rows of photosensitive elements in the array of photosensitive elements. Thus, for other embodiments, near-infrared and/or infrared cut filters may be formed over photosensitive elements one side 402 of the array of photosensitive elements but not over photosensitive elements in the other side 404 the array of photosensitive elements. Similarly, for some embodiments, near-infrared and/or infrared cut filters may be formed over photosensitive elements in the top half the array of photosensitive elements but not over photosensitive elements in the bottom half the array of photosensitive elements.

Figure 5:
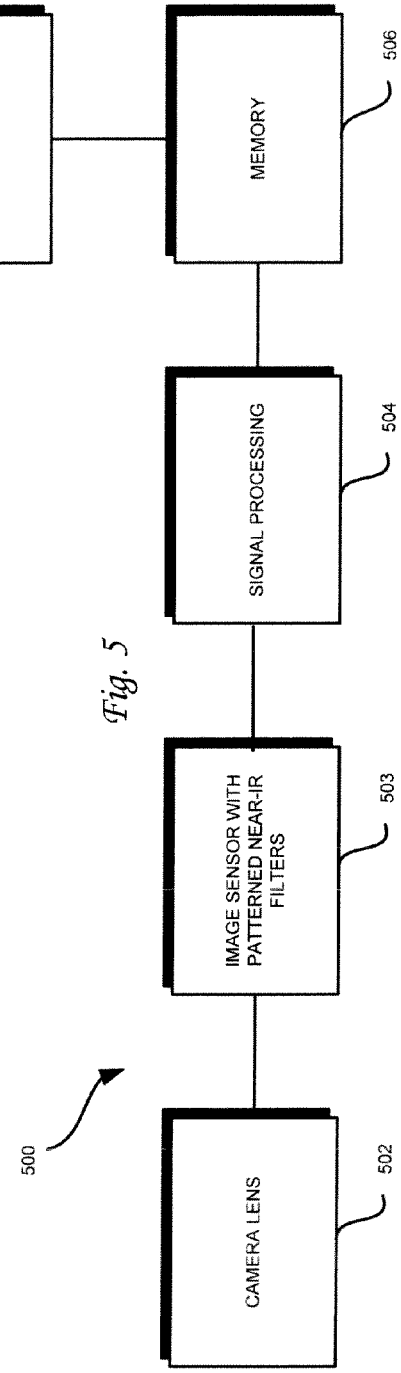
FIG. 5 is a high level block diagram illustrating an imaging device according to an embodiment of the present invention.

FIG. 5 is a high level block diagram illustrating an imaging device 500 according to an embodiment of the present invention. The imaging device 500 may be any device capable of producing still or video images. In the illustrated imaging device 500, a camera lens 502 is coupled to an image sensor 503, which may have the photosensitive array with patterned near-infrared and/or infrared cut filters formed on the photosensitive elements in the array. Alternatively, the near-infrared and/or infrared cut filters may be located anywhere in the optical path of the imaging device 500. The image sensor 503 is optionally coupled to a signal processing block 504, which is optionally coupled to a memory 506. The memory is optionally coupled to an image display device 508. Although the image sensor 503 is illustrated as having the photosensitive array with patterned near-infrared filters, the camera lens 502 may or may not be physically separate from the image sensor 503. The imaging device 500 may be part of a backup camera system for a vehicle such as a truck or automobile.

The imaging device 500 may operate as follows. Visible light and infrared light may be incident on camera lens 502, which passes the visible light and near-infrared and/or infrared light to the image sensor 503. For some embodiments, the portion of the image sensor 503 having near-infrared and/or infrared cut filters formed thereon detects visible light and but not a substantial amount of near-infrared and/or infrared light. The portion of the image sensor 503 not having near-infrared and/or infrared cut filters formed thereon detects near-infrared and/or infrared light but not a substantial amount of visible light.

In one embodiment, the electrical signals from visible light and/or from near-infrared and/or infrared light are processed in the signal processing block 504. This may include analog to digital conversion of signals and digital signal processing, for example. For some embodiments, the electrical signals from the visible light may be combined with the electrical signals from the near-infrared and/or infrared light.

The digital signals may be stored in the memory 506 and displayed on the image display 508. In embodiments in which the imaging device 500 is part of a backup camera system for a vehicle the lens 502 and the sensor array 503 may be on rear of the vehicle and the display 508 may be in the front passenger portion of the vehicle. In other embodiments, memory 506 may not be incorporated as part of imaging device 500.

FIG. 6 illustrates an image sensor 600 according to an alternative embodiment of the present invention. The image sensor 600 includes the substrate 101, which has photosensitive elements 102, 104, and 106 formed therein. In the embodiment shown, the photosensitive elements 102, 104, and 106 may be split pixels and near-infrared and/or infrared cut filters 608 are formed on one of the halves of the photosensitive portions of the pixels with a planarization layer 610 formed on the other halves of the photosensitive portions. In embodiments in which color images may be generated, a color filter 620 may be formed over the photosensitive element 102, a color filter 622 may be formed over the photosensitive element 104, and a color filter 624 may be formed over the photosensitive element 104. A microlens 614 is formed over the color filter 620, a microlens 616 is formed over the color filter 622, and a microlens 618 is formed over the color filter 624. The color filters 620, 622, 624, planarization layers 610, and microlenses 614, 616, and 618 may be formed using any suitable known technique including deposition, etching, masking, planarization, heating, reflow, and/or other suitable techniques.

For the embodiment illustrated in FIG. 6, the microlenses 614, 616, and 618 focus incident visible and near-infrared and/or infrared light to the photosensitive element of the photosensitive elements 102, 104, and 106. The near-infrared and/or infrared cut filters 608 filter out near-infrared and/or infrared light over their corresponding portions of the photosensitive elements. The color filters 620, 622, 624 may be red, blue, green (RGB), or other colors such as cyan, magenta, yellow (CMY) or other colors known in the art to filter colors in image sensors. The color filters 620, 622, 624 may be arranged in any suitable pattern, such as a Bayer pattern or other pattern.

FIG. 7 illustrates an image sensor 700 according to still another embodiment of the present invention. The image sensor 700 includes the substrate 101, which has the photosensitive elements 102, 104, and 106 formed therein. A microlens 714 is formed over the photosensitive elements 102, a microlens 716 is formed over the photosensitive elements 104, and a microlens 718 is formed over the photosensitive elements 106. As illustrated, a near-infrared and/or infrared cut filter 608 is formed on the microlens 714 and a near-infrared and/or infrared cut filter 608 is formed on the microlens 718. For some embodiments, the pattern illustrated in FIG. 7 may be every other pixel in that no infrared and or infrared cut filter is formed on the pixel having the microlens 716 and the photosensitive element 104. For other embodiments, the pattern illustrated in FIG. 7 may be every other row in that no infrared and/or infrared cut filter is formed on the row of pixels having the microlens 716 and the photosensitive element 104.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

The operations of the methods herein have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the methods are example methods and other methods may be used to implement embodiments of the present invention.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
a photodiode having a first portion and a second portion formed in a semiconductor substrate;
a near-infrared cut filter formed over the first portion of the photodiode, wherein the near-infrared cut filter filters out near-infrared light while permitting visible light to pass to the first portion of the photodiode;
a planarization layer formed over the second portion of the photodiode, wherein the second portion of the photodiode is disposed without the near-infrared cut filter formed thereon such that the second portion of the photodiode receives visible light and near-infrared light, and wherein the planarization layer is laterally adjacent to the near-infrared cut filter; and
a color filter disposed over the first portion and the second portion of the photodiode.

2. The image sensor of claim 1, wherein the near-infrared cut filter is formed over one half of the photodiode.

3. The image sensor of claim 1, wherein the near-infrared cut filter comprises an absorptive filter.

4. The image sensor of claim 1, wherein the near-infrared cut filter comprises an interference filter.

5. The image sensor of claim 1, further comprising a microlens disposed over the first portion and the second portion of the photodiode.

6. The image sensor of claim 1, further comprising a microlens disposed between the near-infrared cut filter and the photodiode.

7. The image sensor of claim 1, wherein the planarization layer is disposed over the second portion of the photodiode and not over the first portion of the photodiode.

8. A camera, comprising:
a photodiode having a first portion and a second portion formed in a semiconductor substrate;
a lens disposed in an optical path to the photodiode;
a near-infrared cut filter formed over the first portion of the photodiode and disposed in the optical path, wherein the near-infrared cut filter filters out near-infrared light while permitting visible light to pass to the first portion of the photodiode;
a planarization layer formed over the second portion of the photodiode, wherein the second portion of the photodiode is disposed without the near-infrared cut filter formed thereon such that the second portion of the photodiode receives visible light and near-infrared light, and wherein the planarization layer is laterally adjacent to the near-infrared cut filter; and
a color filter disposed over the first portion and the second portion of the photodiode.

9. The camera of claim 8, further comprising circuitry to process signals from the photodiode.

10. The camera of claim 9, further comprising circuitry to generate images from the processed signals.

11. The camera of claim 10, further comprising memory to store the images generated.

12. The camera of claim 8, further comprising a microlens disposed over the first portion and the second portion of the photodiode.

13. The camera of claim 8, further comprising a microlens disposed between the near-infrared filter and the photodiode.

14. The camera of claim 8, wherein the planarization layer is disposed over the second portion of the photodiode and not over the first portion of the photodiode.

15. A method for operating an image sensor, comprising:
receiving visible light through a color filter and a near-infrared cut filter at a first portion of a photodiode, wherein the near-infrared cut filter filters out near-infrared light while permitting visible light to pass to the first portion of the photodiode; and
receiving visible light and near-infrared light through the color filter and a planarization layer at a second portion of the photodiode, wherein the planarization layer is laterally adjacent to the near infrared cut filter.

16. The method of claim 15, further comprising:
processing signals from the first portion of the photodiode; and
generating an image from the processed signals.

17. The method of claim 15, further comprising:
processing signals from the second portion of the photodiode; and
generating an image from the processed signals.

18. The method of claim 15, further comprising:
processing first signals from the first portion of the photodiode;
processing second signals from the second portion of the photodiode;
combining first and second processed signals; and
generating an image from the combined processed first and second signals.

19. The method of claim 15, further comprising focusing light with a microlens disposed over the first portion and the second portion of the photodiode.

20. The method of claim 15, further comprising focusing light with a microlens disposed between the near-infrared filter and the photodiode.

* * * * *